United States Patent
Cassia et al.

(10) Patent No.: US 8,395,435 B2
(45) Date of Patent: Mar. 12, 2013

(54) SWITCHES WITH BIAS RESISTORS FOR EVEN VOLTAGE DISTRIBUTION

(75) Inventors: Marco Cassia, San Diego, CA (US); Jeremy D. Dunworth, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 78 days.

(21) Appl. No.: 12/615,107

(22) Filed: Nov. 9, 2009

(65) Prior Publication Data

US 2011/0025408 A1  Feb. 3, 2011

Related U.S. Application Data

(60) Provisional application No. 61/230,091, filed on Jul. 30, 2009.

(51) Int. Cl.
 *H03K 17/687* (2006.01)
(52) U.S. Cl. ........ 327/436; 327/534
(58) Field of Classification Search ........ 327/436, 327/534
 See application file for complete search history.

(56) References Cited

U.S. PATENT DOCUMENTS

| | | | | |
|---|---|---|---|---|
| 4,132,865 A * | 1/1979 | Szechenyi | | 379/32.01 |
| 5,808,502 A | 9/1998 | Hui et al. | | |
| 5,818,099 A * | 10/1998 | Burghartz | | 257/548 |
| 6,094,088 A | 7/2000 | Yano | | |
| 6,400,252 B1 * | 6/2002 | Smith et al. | | 338/308 |
| 6,804,502 B2 * | 10/2004 | Burgener et al. | | 455/333 |
| 6,978,149 B1 * | 12/2005 | Morelli et al. | | 455/522 |
| 7,088,971 B2 * | 8/2006 | Burgener et al. | | 455/127.1 |
| 7,106,121 B2 * | 9/2006 | Hidaka et al. | | 327/308 |
| 7,173,471 B2 * | 2/2007 | Nakatsuka et al. | | 327/308 |
| 7,199,635 B2 * | 4/2007 | Nakatsuka et al. | | 327/308 |
| 7,236,044 B2 * | 6/2007 | Talwalkar et al. | | 327/534 |
| 7,459,988 B1 * | 12/2008 | Iversen | | 333/103 |
| 7,642,859 B2 * | 1/2010 | Shimada | | 330/302 |
| 7,848,712 B2 * | 12/2010 | Fu et al. | | 455/80 |
| 2001/0050951 A1 * | 12/2001 | Dellon et al. | | 375/219 |
| 2004/0207454 A1 * | 10/2004 | Hidaka et al. | | 327/427 |
| 2005/0014473 A1 * | 1/2005 | Zhao et al. | | 455/83 |
| 2006/0199563 A1 * | 9/2006 | Kelly et al. | | 455/333 |
| 2006/0267666 A1 * | 11/2006 | Toda | | 327/427 |

(Continued)

FOREIGN PATENT DOCUMENTS

| DE | 102008004861 | 7/2009 |
|---|---|---|

OTHER PUBLICATIONS

International Search Report and Written Opinion—PCT/US2010/044032, International Search Authority—European Patent Office—Oct. 8, 2010.

(Continued)

*Primary Examiner* — Thomas J Hiltunen
(74) *Attorney, Agent, or Firm* — Ramin Mobarhan

(57) ABSTRACT

Switches with connected bulk for improved switching performance and bias resistors for even voltage distribution to improve reliability are described. In an exemplary design, a switch may include a plurality of transistors coupled in a stack and at least one resistor coupled to at least one intermediate node in the stack. The transistors may have (i) a first voltage applied to a first transistor in the stack and (ii) a second voltage that is lower than the first voltage applied to bulk nodes of the transistors. The resistor(s) may maintain matching bias conditions for the transistors when they are turned off. In one exemplary design, one resistor may be coupled between the source and drain of each transistor. In another exemplary design, one resistor may be coupled between each intermediate node and the first voltage. The resistor(s) may maintain the source of each transistor at the first voltage.

16 Claims, 9 Drawing Sheets

U.S. PATENT DOCUMENTS

| | | | |
|---|---|---|---|
| 2007/0049237 A1* | 3/2007 | Miura et al. | 455/333 |
| 2007/0069291 A1* | 3/2007 | Stuber et al. | 257/347 |
| 2007/0222523 A1* | 9/2007 | Arell | 330/302 |
| 2007/0281629 A1* | 12/2007 | Ahn et al. | 455/78 |
| 2008/0064358 A1* | 3/2008 | Sagae et al. | 455/333 |
| 2008/0290928 A1* | 11/2008 | Kawakyu et al. | 327/429 |
| 2010/0117713 A1* | 5/2010 | Katoh et al. | 327/427 |
| 2011/0001544 A1* | 1/2011 | Ranta et al. | 327/427 |
| 2011/0025403 A1* | 2/2011 | Cassia | 327/434 |
| 2011/0025404 A1* | 2/2011 | Cassia | 327/436 |
| 2011/0148503 A1* | 6/2011 | Granger-Jones et al. | 327/308 |
| 2011/0260774 A1* | 10/2011 | Granger-Jones et al. | 327/427 |
| 2011/0260780 A1* | 10/2011 | Granger-Jones et al. | 327/537 |

OTHER PUBLICATIONS

Huang, et al., "Novel double pole double throw switchplexer that simplifies dual-band WLAN and MIMO front-end module designs," Microwave Symposium Digest, 2008 IEEE MTT-S International, Jun. 15-20, 2008, pp. 1183-1186.

* cited by examiner

SWITCHES WITH BIAS RESISTORS FOR EVEN VOLTAGE DISTRIBUTION

I. CLAIM OF PRIORITY UNDER 35 U.S.C. §119

The present application for patent claims priority to Provisional U.S. Application Ser. No. 61/230,091, entitled "BIAS RESISTORS FOR EVEN VOLTAGE DISTRIBUTION," filed Jul. 30, 2009, assigned to the assignee hereof, and expressly incorporated herein by reference.

BACKGROUND

I. Field

The present disclosure relates generally to electronics, and more specifically to switches.

II. Background

Switches are commonly used in various electronics circuits such as a transmitter in a wireless communication device. Switches may be implemented with various types of transistors such as metal oxide semiconductor (MOS) transistors. A switch may receive an input signal at one terminal and a control signal. The switch may pass the input signal to the other terminal if it is turned on by the control signal and may block the input signal if it is turned off by the control signal. It may be desirable to obtain good performance and high reliability for the switch.

DETAILED DESCRIPTION

The word "exemplary" is used herein to mean "serving as an example, instance, or illustration." Any design described herein as "exemplary" is not necessarily to be construed as preferred or advantageous over other designs.

Switches with connected bulk for improved switching performance and bias resistors for even voltage distribution to improve reliability in an off state are described herein. These switches may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the switches in a wireless communication device is described below.

Figure 1:
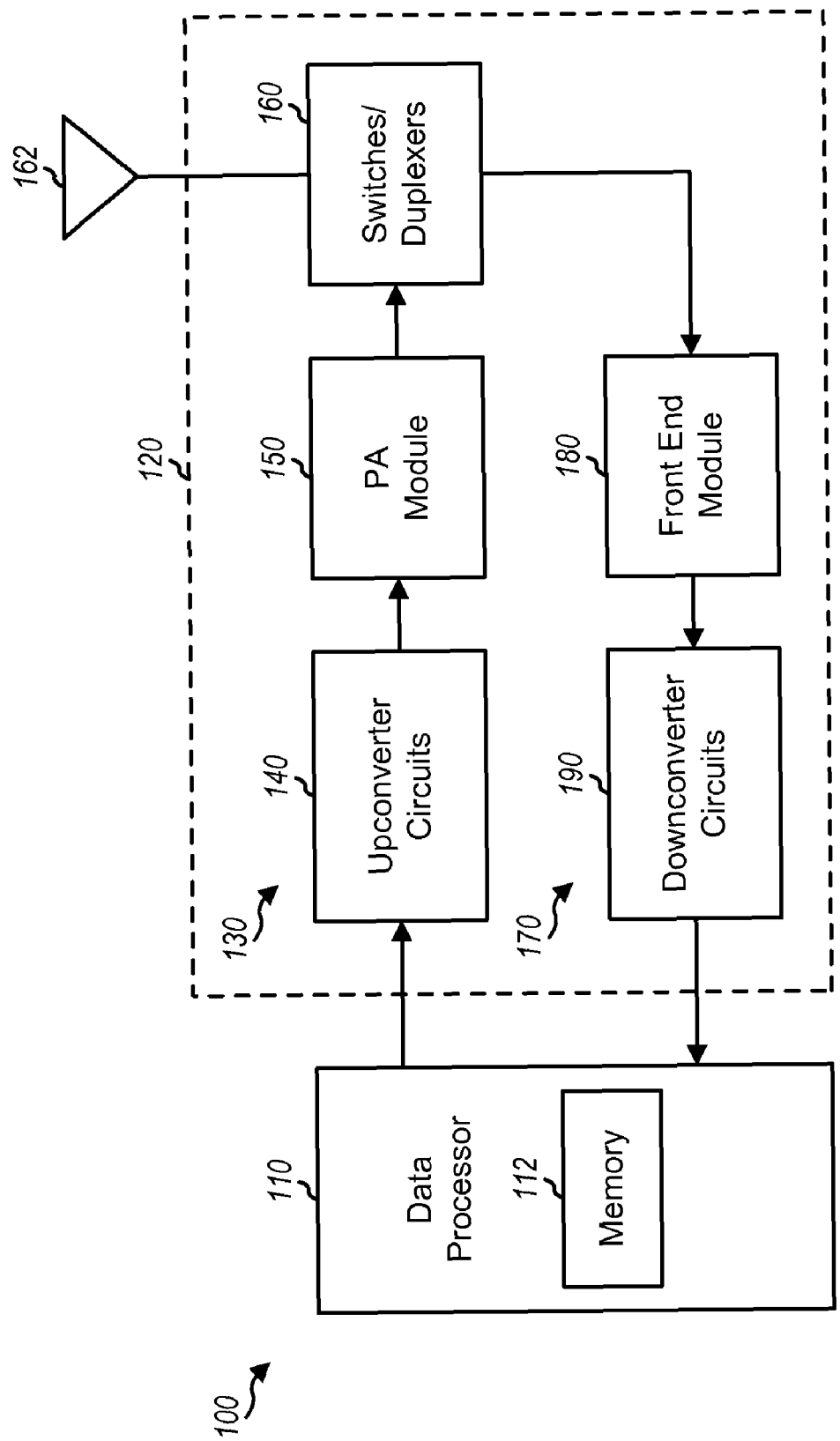
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 170 that support bi-directional communication.

In the transmit path, data processor 110 may process (e.g., encode and modulate) data to be transmitted and provide an output baseband signal to transmitter 130. Within transmitter 130, upconverter circuits 140 may process (e.g., amplify, filter, and frequency upconvert) the output baseband signal and provide an upconverted signal. Upconverter circuits 140 may include amplifiers, filters, mixers, etc. A power amplifier (PA) module 150 may amplify the upconverted signal to obtain the desired output power level and provide an output radio frequency (RF) signal, which may be routed through switches/duplexers 160 and transmitted via an antenna 162.

In the receive path, antenna 162 may receive RF signals transmitted by base stations and/or other transmitter stations and may provide a received RF signal, which may be routed via switches/duplexers 160 and provided to receiver 170. Within receiver 170, a front end module 180 may process (e.g., amplify and filter) the received RF signal and provide an amplified RF signal. Front end module 180 may include low noise amplifiers (LNA), filters, etc. Downconverter circuits 190 may further process (e.g., frequency downconvert, filter, and amplify) the amplified RF signal and provide an input baseband signal to data processor 110. Downconverter circuits 190 may include mixers, filters, amplifiers, etc. Data processor 110 may further process (e.g., digitize, demodulate, and decode) the input baseband signal to recover transmitted data.

FIG. 1 shows an exemplary design of transmitter 130 and receiver 170. All or a portion of transmitter 130 and/or all or a portion of receiver 170 may be implemented on one or more analog integrated circuits (ICs), RF ICs (RFICs), mixed-signal ICs, etc.

Data processor 110 may generate controls for the circuits and modules in transmitter 130 and receiver 170. The controls may direct the operation of the circuits and modules to obtain the desired performance. Data processor 110 may also perform other functions for wireless device 100, e.g., processing for data being transmitted or received. A memory 112 may store program codes and data for data processor 110. Data processor 110 may be implemented on one or more application specific integrated circuits (ASICs) and/or other ICs.

Figure 2:
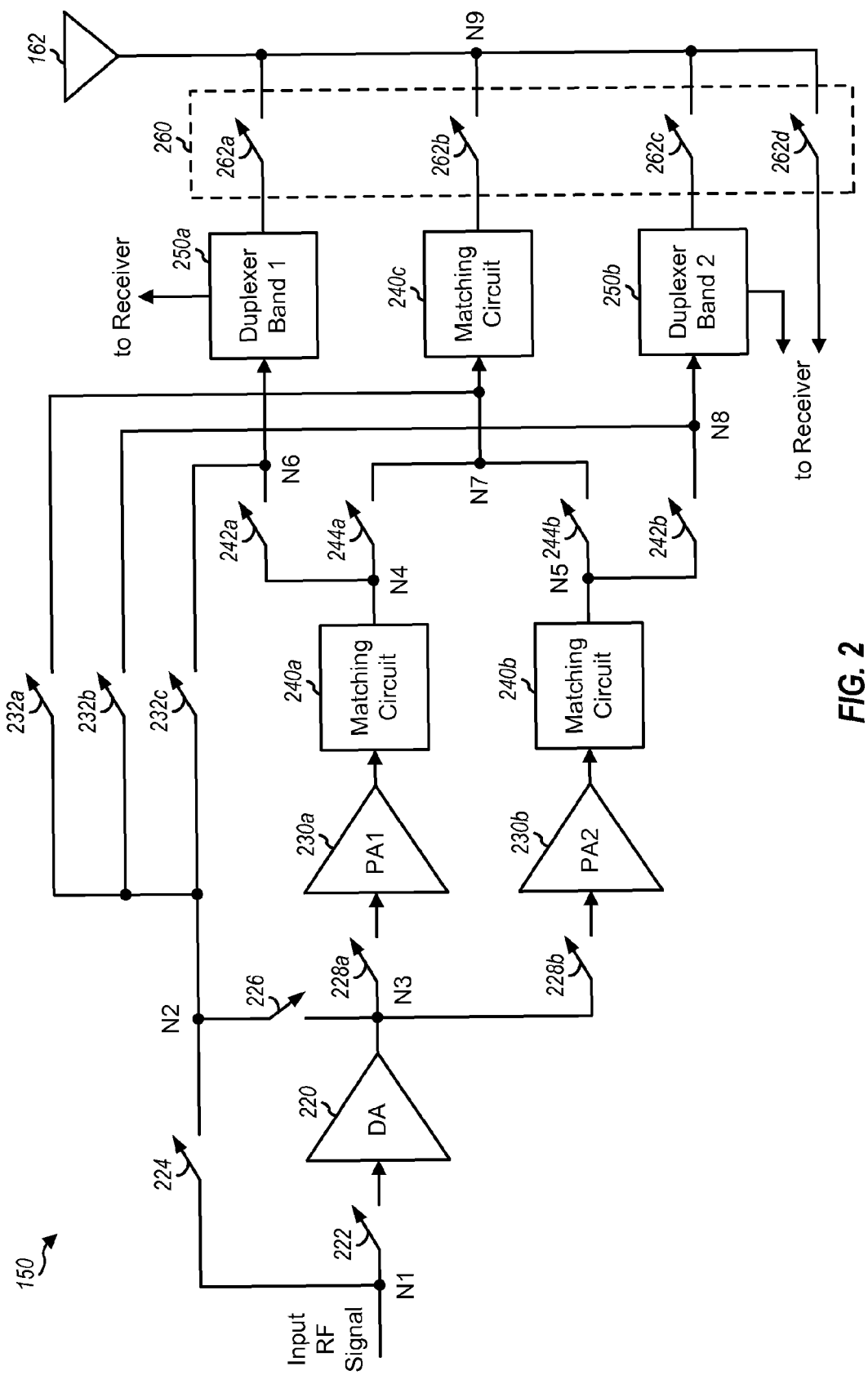
FIG. 2 shows a power amplifier (PA) module and a switchplexer.

FIG. 2 shows a block diagram of an exemplary design of PA module 150 and switches/duplexers 160 in FIG. 1. In the exemplary design shown in FIG. 2, switches/duplexers 160 include duplexers 250a and 250b and a switchplexer 260. PA module 150 includes the remaining circuits in FIG. 2.

Within PA module 150, a switch 222 is coupled between node N1 and the input of a driver amplifier (DA) 220, and the output of driver amplifier 220 is coupled to node N3. An input RF signal is provided to node N1. A switch 224 is coupled between nodes N1 and N2, and a switch 226 is coupled between nodes N2 and N3. A switch 228a is coupled between node N3 and the input of a first power amplifier (PA1) 230a, and a switch 228b is coupled between node N3 and the input of a second power amplifier (PA2) 230b. A matching circuit 240a is coupled between the output of power amplifier 230a and node N4, and a matching circuit 240b is coupled between the output of power amplifier 230b and node N5. Switches 232a, 232b and 232c have one end coupled to node N2 and the other end coupled to nodes N7, N8 and N6, respectively. Switches 242a and 244a have one end coupled to node N4 and the other end coupled to nodes N6 and N7, respectively. Switches 242b and 244b have one end coupled to node N5 and the other end coupled to nodes N8 and N7, respectively. A matching circuit 240c is coupled in series with a switch 262b, and the combination is coupled between nodes N7 and N9.

Duplexer 250a for band 1 has its transmit port coupled to node N6, its receive port coupled to a receiver (e.g., front end module 180 in FIG. 1), and its common port coupled to node N9 via a switch 262a. Duplexer 250b for band 2 has its transmit port coupled to node N8, its receive port coupled to the receiver, and its common port coupled to node N9 via a switch 262c. A switch 262d is coupled between node N9 and the receiver and may be used to support time division duplexing (TDD), e.g., for Global System for Mobile Communications (GSM). Antenna 162 is coupled to node N9.

Driver amplifier 220 may be selected to provide signal amplification or may be bypassed. Each power amplifier 230 may also be selected to provide power amplification or may be bypassed. Matching circuit 240a may provide output impedance matching for power amplifier 230a, and matching circuit 240b may provide output impedance matching for power amplifier 230b. Matching circuits 240a and 240b may each provide a target input impedance (e.g., 4 to 6 Ohms) and a target output impedance (e.g., 50 Ohms). Matching circuit 240c may provide impedance matching for matching circuits 240a and 240b when both power amplifiers 230a and 230b are enabled and switches 244a and 244b are closed. Matching circuits 240a, 240b and 240c may also provide filtering to attenuate undesired signal components at harmonic frequencies.

PA module 150 may support a number of operating modes. Each operating mode may be associated with a different signal path from node N1 to node N9 via zero or more amplifiers. One operating mode may be selected at any given moment. The signal path for the selected operating mode may be obtained by properly controlling the switches within transmitter 150. For example, a high power mode may be associated with a signal path from node N1 through switch 222, driver amplifier 220, switches 228a and 228b, power amplifiers 230a and 230b, matching circuits 240a and 240b, switches 244a and 244b, matching circuit 240c, and switch 262b to antenna 162. A medium power mode may be associated with a signal path from node N1 through switch 222, driver amplifier 220, switch 228a, power amplifier 230a, matching circuit 240a, switch 244a, matching circuit 240c, and switch 262b to antenna 162. A low power mode may be associated with a signal path from node N1 through switch 222, driver amplifier 220, switches 226 and 232a, matching circuit 240c, and switch 262b to antenna 162. A very low power mode may be associated with a signal path from node N1 through switches 224 and 232a, matching circuit 240c, and switch 262b to antenna 162. Other operating modes may also be supported.

In the exemplary design shown in FIG. 2, switches may be used to route RF signals and support multiple operating modes. The switches may be implemented with MOS transistors, transistors of other types, and/or other circuit components. For clarity, switches implemented with MOS transistors are described below. The switches may also be fabricated with various IC process technologies. For example, the switches may be fabricated with silicon-on-insulator (SOI), which is an IC process in which a thin layer of silicon is formed on top of an insulator such as silicon oxide or glass. MOS transistors for switches may then be built on top of this thin layer of silicon. The SOI process may reduce parasitic capacitances of the switches, which may be able to operate faster.

Figure 3:
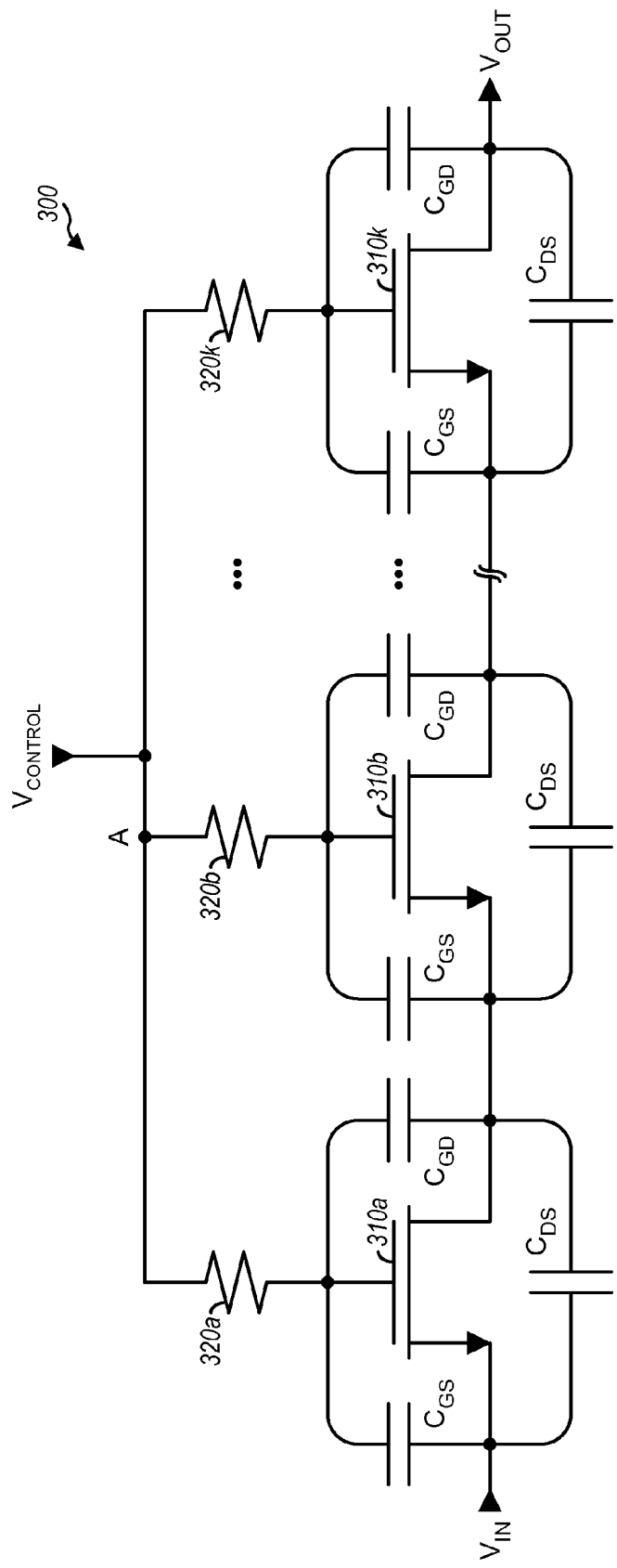
FIG. 3 shows a switch implemented with stacked MOS transistors.

FIG. 3 shows a schematic diagram of a switch 300 implemented with stacked N-channel MOS (NMOS) transistors. Within switch 300, K NMOS transistors 310a through 310k are coupled in a stacked configuration (or in series), where K may be any integer value greater than one. Each NMOS transistor 310 (except for the last NMOS transistor 310k) has its drain coupled to the source of a following NMOS transistor. The first NMOS transistor 310a has its source receiving an input RF signal ($V_{IN}$), and the last NMOS transistor 310k has its drain providing an output RF signal ($V_{OUT}$). Each NMOS transistor 310 may be implemented with a symmetric structure, and the source and drain of each NMOS transistor may be interchangeable.

K source bias resistors 320a through 320k have one end coupled to node A and the other end coupled to the gate of NMOS transistors 310a through 310k, respectively. Resistors 320a through 320k may have the same resistor value, which may be relatively large, e.g., more than one kilo Ohm (kΩ). A control signal ($V_{CONTROL}$) is applied to node A to turn on or off NMOS transistors 310.

FIG. 3 shows a switch implemented with NMOS transistors. A switch may also be implemented with P-channel MOS (PMOS) transistors or transistors of other types. For simplicity, switches implemented with NMOS transistors are described below. The techniques described herein may be applied to switches implemented with NMOS transistors, PMOS transistors, and/or transistors of other types.

Ideally, each NMOS transistor 310 in switch 300 should pass the $V_{IN}$ signal when it is turned on and should block the $V_{IN}$ signal when it is turned off. However, in practice, each NMOS transistor 310 has finite off impedance. Furthermore, each NMOS transistor 310 has parasitic gate-to-source capacitance ($C_{GS}$), parasitic gate-to-drain capacitance ($C_{GD}$), and parasitic drain-to-source capacitance ($C_{DS}$), as shown in FIG. 3. These parasitic capacitances may affect the operation of switch 300 in an off state as well as an on state. For simplicity, other parasitic capacitances may be assumed to be negligible. For example, the source-to-bulk, source-to-substrate, drain to-bulk, and drain-to-substrate parasitic capacitances may be assumed to be negligible, or their effects may be mitigated, e.g., through the SOI process.

Figure 4A:
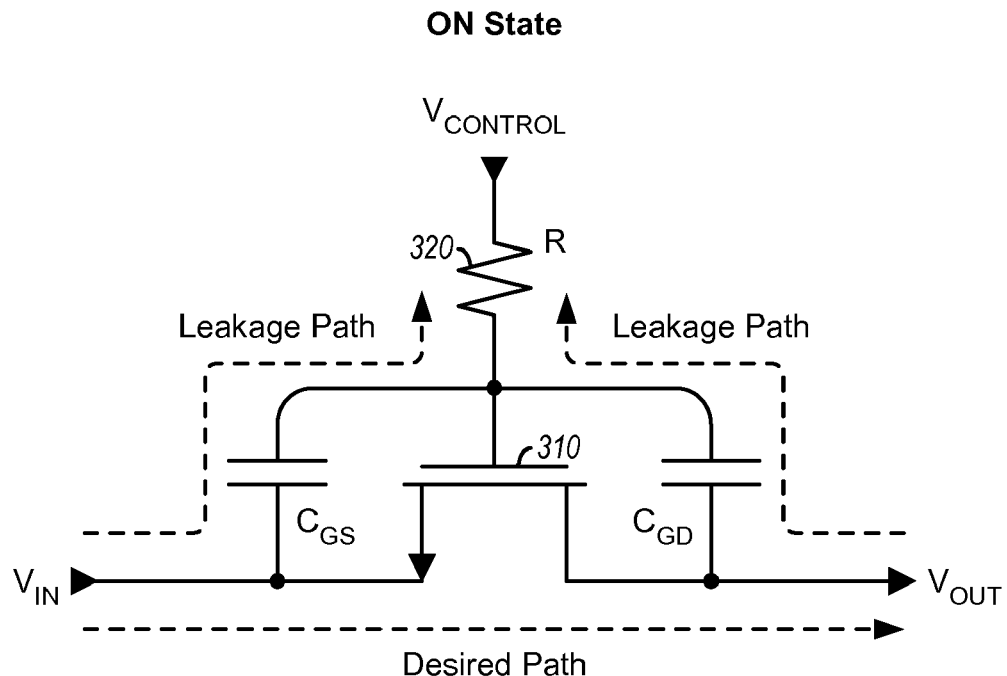
FIG. 4A shows one MOS transistor in an on state.

FIG. 4A shows operation of one NMOS transistor 310 in switch 300 in the on state. When NMOS transistor 310 is turned on, a portion of the $V_{IN}$ signal passes through a leakage path via the $C_{GS}$ and $C_{GD}$ capacitors to the $V_{CONTROL}$ signal source, which may have a low impedance. To reduce this signal loss, the gate of NMOS transistor 310 may be RF floated via an associated resistor 320. When NMOS transistor 310 is turned on, the leakage path would then be via the $C_{GS}$ and $C_{GD}$ capacitors as well as resistor 320 to the $V_{CONTROL}$ signal source. The high resistance of resistor 320 may essentially float the gate of NMOS transistor 310 at RF frequency, which may then reduce signal loss. Although not shown in FIG. 3, the $V_{CONTROL}$ signal may be applied to one end of an additional resistor having its other end coupled to node A. This additional resistor may further reduce signal loss and improve switching performance.

Figure 4B:
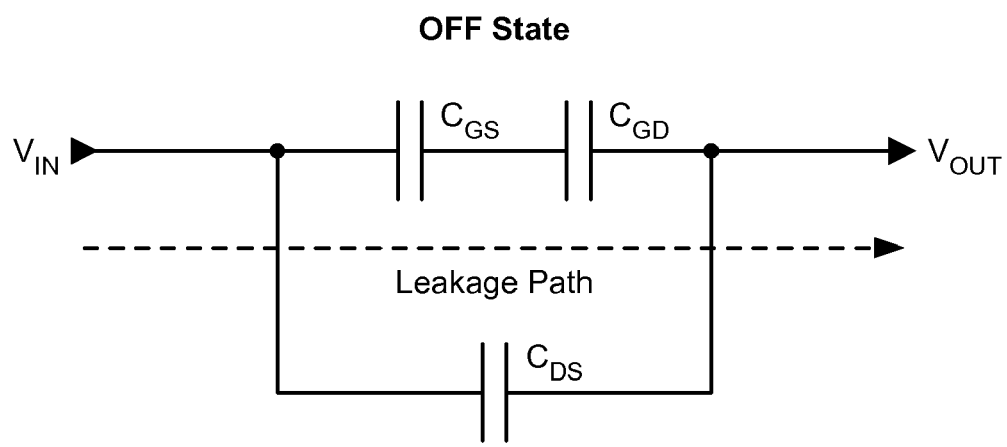
FIG. 4B shows one MOS transistor in an off state.

FIG. 4B shows operation of one NMOS transistor 310 in switch 300 in the off state. When NMOS transistor 310 is turned off, a portion of the $V_{IN}$ signal passes through a leakage path comprising (i) a first path through the $C_{GS}$ and $C_{GD}$ capacitors coupled in series and (ii) a second path through the $C_{DS}$ capacitor, which is in parallel with the first path. The impedance $Z_{OFF}$ of the leakage path in the off state may be expressed as:

$$|Z_{OFF}| = \frac{1}{\omega \cdot C_{OFF}}, \text{ and} \quad \text{Eq (1)}$$

-continued $$C_{OFF} = C_{DS} + \frac{C_{GS} \cdot C_{GD}}{C_{GS} + C_{GD}},$$  Eq (2)

where $C_{OFF}$ is the total capacitance in the leakage path due to the parasitic $C_{DS}$, $C_{GS}$ and $C_{GD}$ capacitors, and $\omega$ is the frequency of interest.

Figure 5:
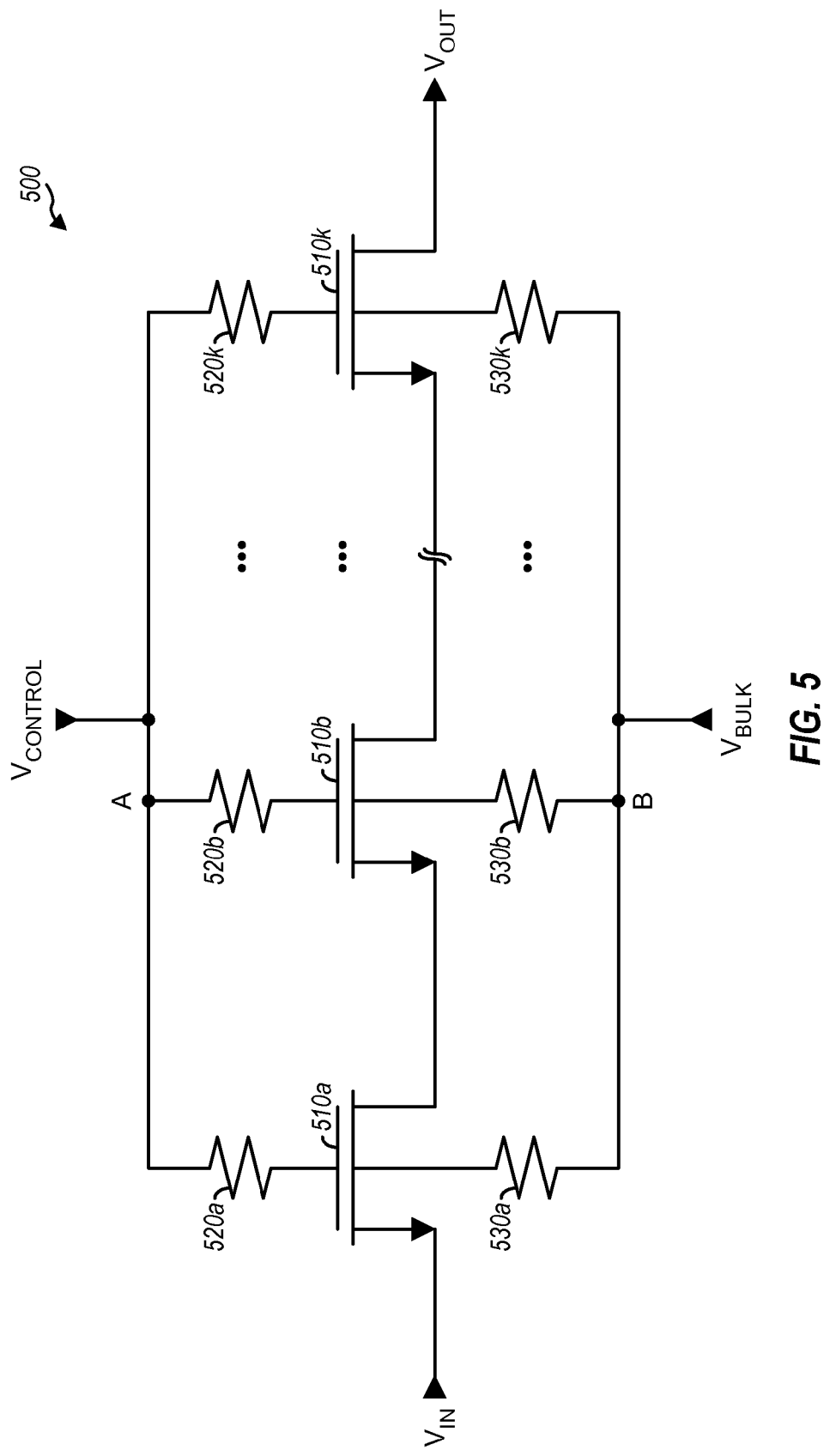
FIG. 5 shows a switch with connected bulk to improve switching performance.

FIG. 5 shows a schematic diagram of a switch 500 with connected bulk to improve switching performance. Switch 500 is implemented with K stacked NMOS transistors 510a through 510k and K source bias resistors 520a through 520k, which are coupled in similar manner as NMOS transistors 310a through 310k and resistors 320a through 320k in FIG. 3. Switch 500 further includes K bulk bias resistors 530a through 530k having one end coupled to node B and the other end coupled to the bulk nodes of NMOS transistors 510a through 510k, respectively. A bulk voltage ($V_{BULK}$) is applied to node B. Resistors 530 provide RF float for the bulk nodes of NMOS transistors 510, which may provide benefits similar to those obtained with resistors 520 to RF float the gates of NMOS transistors 510.

The $V_{BULK}$ voltage may be selected to be lower than the direct current (DC) voltages at the sources of NMOS transistors 510. The $V_{BULK}$ voltage may be applied to the bulk nodes of NMOS transistors 510 via resistors 530 to obtain several advantages. First, the $V_{BULK}$ voltage may improve the on/off conditions of NMOS transistors 510 by acting on a source-to-bulk voltage ($V_{SB}$). In particular, the $V_{BULK}$ voltage may reduce a threshold voltage ($V_{TH}$) of NMOS transistors 510 when they are turned on and/or may increase the threshold voltage when they are turned off, which may then improve the on/off conditions. Second, the $V_{BULK}$ voltage may improve the linearity of NMOS transistors 510 when they are turned on. Computer simulations indicate that a negative $V_{SB}$ voltage due to the $V_{BULK}$ voltage may reduce harmonics resulting from nonlinearity of NMOS transistors 510. Switch 500 with connected bulk in FIG. 5 may also have other advantages over switch 300 with no bulk contact (or floating bulk) in FIG. 3. However, the $V_{BULK}$ voltage may degrade the reliability of NMOS transistors 510 in the off state.

Figure 6:
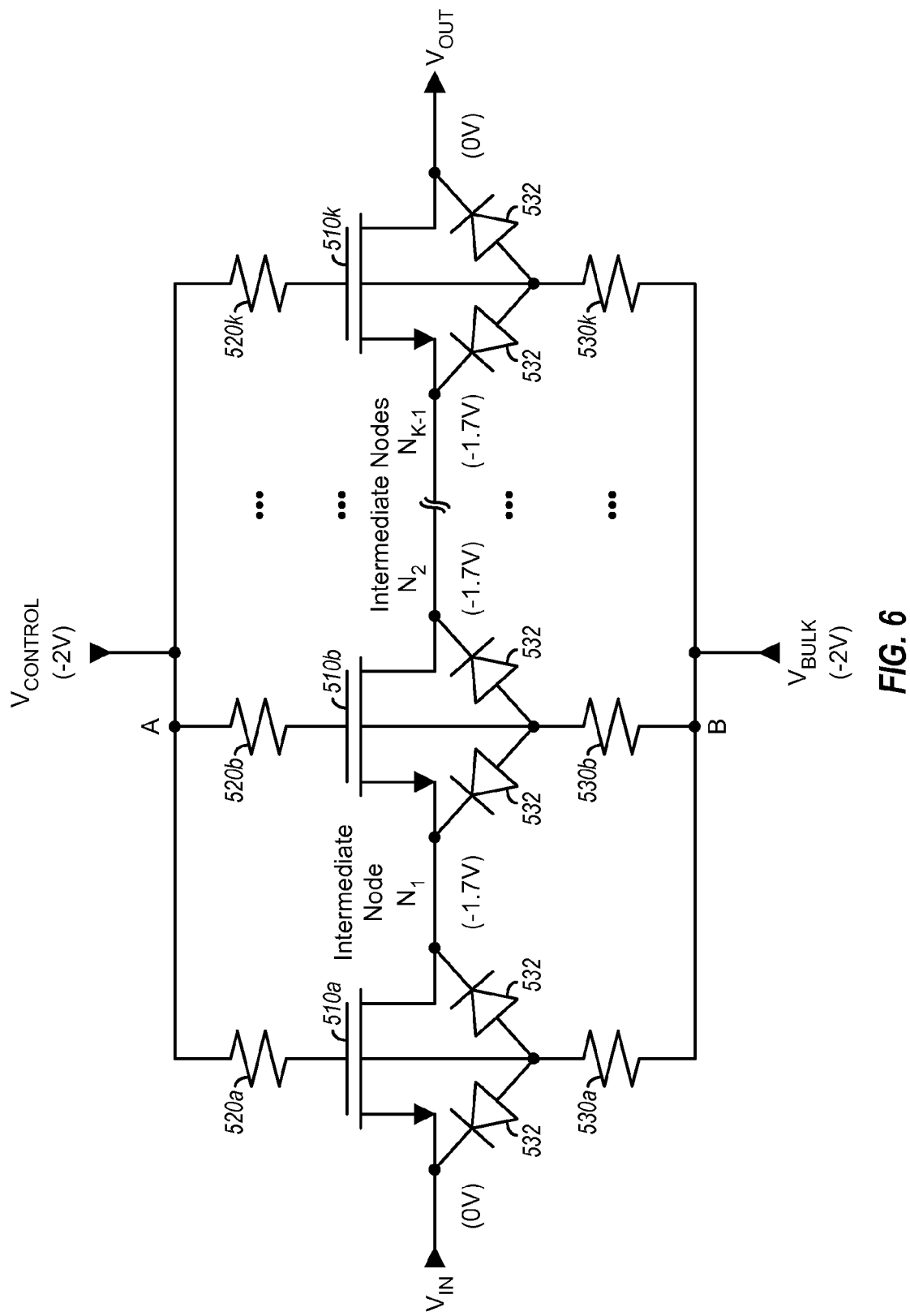
FIG. 6 shows voltages at various nodes within the switch in FIG. 5 in an off state.

FIG. 6 shows DC voltages at various nodes within switch 500 in FIG. 5 in the off state. In the example shown in FIG. 6, the $V_{IN}$ signal has a DC voltage of zero Volts (0V), the $V_{OUT}$ signal also has a DC voltage of 0V, the $V_{BULK}$ voltage is set at −2V, and the $V_{CONTROL}$ signal is also set at −2V. NMOS transistors 510 are turned off by the low $V_{CONTROL}$ voltage. In general, in the off state, the $V_{BULK}$ voltage should be lower than the source voltages of NMOS transistors 510 in order to provide the above mentioned benefits As shown in FIG. 6, parasitic diodes 532 may be present between the drains and sources of NMOS transistors 510 to the bulk resistors 530. For each NMOS transistor 510, one parasitic diode 532 may have its anode coupled to bulk resistor 530 and its cathode coupled to the source of the NMOS transistor. Another parasitic diode 532 may have its anode coupled to bulk resistors 530 and its cathode coupled to the drain of the NMOS transistor.

Parasitic diodes 532 may be reverse biased when the $V_{BULK}$ voltage is lower than the source voltage of NMOS transistors 510. Some leakage current may then flow through parasitic diodes 532, which may then set intermediate nodes $N_1$ through $N_{K-1}$ of stacked NMOS transistors 510 to negative voltages. Each intermediate node may correspond to a connection between the source of one NMOS transistor and the drain of another NMOS transistor. Depending on bias conditions and device sizes, the intermediate nodes may be set to a voltage potential close to $V_{BULK}$.

The negative voltages at the intermediate nodes of stacked NMOS transistors 510 due to the negative $V_{BULK}$ voltage may degrade reliability of NMOS transistors 510. In particular, the first NMOS transistor 510a and the last NMOS transistor 510k may each observe a non-zero drain-to-source voltage ($V_{DS}$) whereas each remaining NMOS transistor 510 may observe a $V_{DS}$ voltage of approximately 0V. The bias conditions of the first and last NMOS transistors 510a and 510k may thus be changed in comparison to the bias conditions of the remaining NMOS transistors 510. This may then result in an uneven voltage distribution/splitting during the off state. For example, switch 500 and a second switch may be coupled to a common node, switch 500 may be in the off state, and the second switch may be in the on state and may pass a large RF signal to the common node. One terminal of switch 500 may observe the large RF signal whereas the other terminal of switch 500 may be at 0V DC. The large RF signal should be divided or split evenly across the K NMOS transistors 510 in switch 500, so that each NMOS transistor 510 can observe a fraction of the large RF signal across its drain and source. This may then improve reliability of NMOS transistors 510. However, the difference in the bias conditions of the two end NMOS transistors 510a and 510k versus the bias conditions of the middle NMOS transistors 510 may result in the large RF signal being split unevenly across the K NMOS transistors 510a through 510k. Each NMOS transistor 510 that observes a larger portion of the RF signal may be less reliable.

Figure 7:
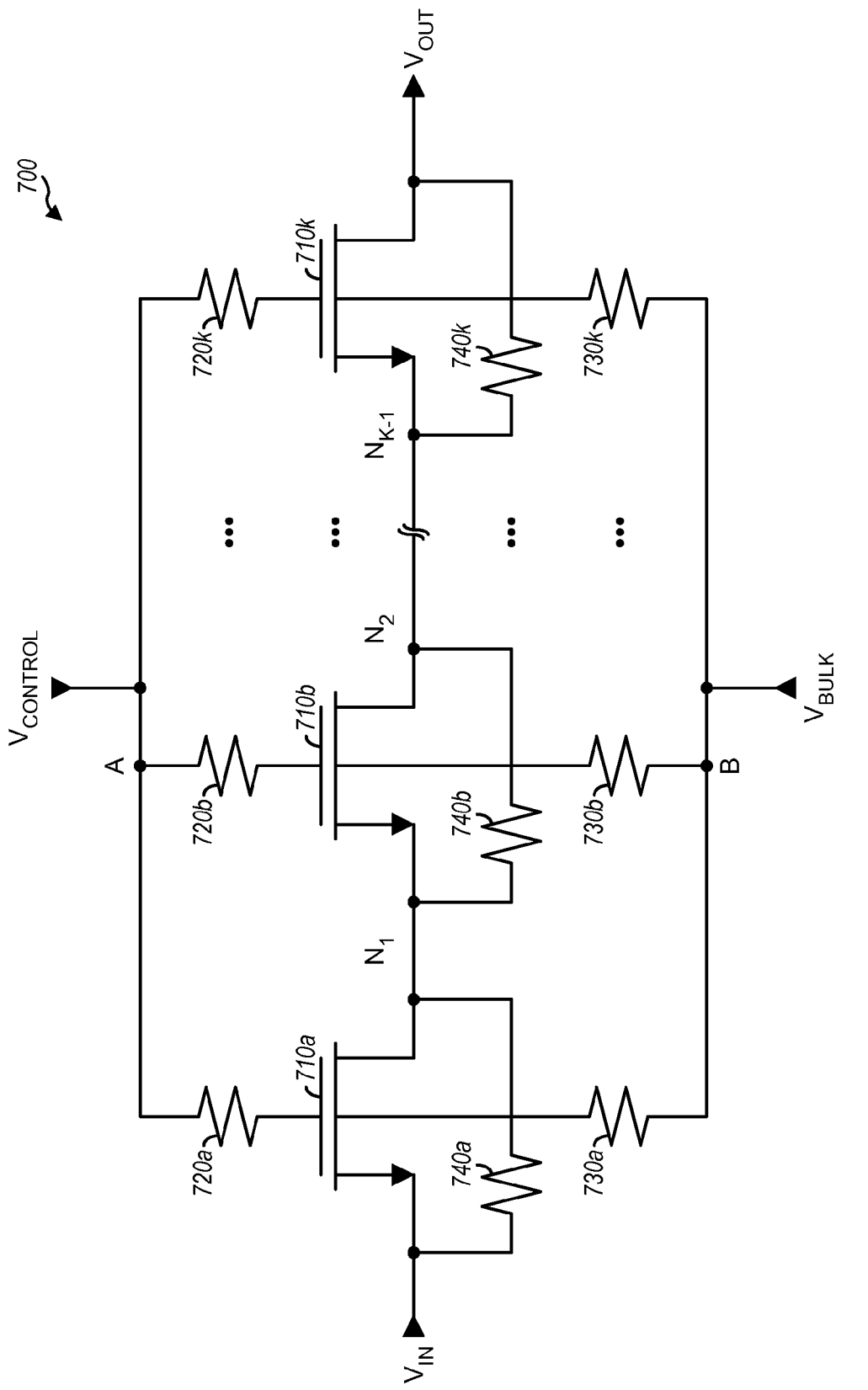
FIGS. 7 and 8 show two exemplary designs of a switch with connected bulk for improved switching performance and bias resistors for even voltage distribution.

FIG. 7 shows a schematic diagram of an exemplary design of a switch 700 with connected bulk for improved switching performance and bias resistors for even voltage distribution to improve reliability in the off state. Switch 700 may be used for any of the switches shown in FIG. 2. Switch 700 is implemented with K stacked NMOS transistors 710a through 710k, K source bias resistors 720a through 720k, and K bulk bias resistors 730a through 730k, which are coupled in similar manner as NMOS transistors 510a through 510k, resistors 520a through 520k, and resistors 530a through 530k in FIG. 3. Switch 700 further includes K bias resistors 740a through 740k for the K NMOS transistors 710a through 710k, respectively. Each bias resistor 740 is coupled between the source and drain of an associated NMOS transistor 710.

Bias resistors 740a through 740k may maintain the intermediate nodes $N_1$ through $N_{K-1}$ at approximately the same voltage (e.g., the source DC bias voltage) when switch 700 is in the off state. Each bias resistor 740 can provide a DC bias path that can maintain approximately the same voltage at the drain and source of the associated NMOS transistor 710. This may then result in matching bias conditions for all K NMOS transistors 710a through 710k. The matching bias conditions may be quantified by the K NMOS transistors 710a through 710k having similar source/drain DC voltage conditions. The matching bias conditions for the K NMOS transistors 710a through 710k may result in equal voltage splitting during the off state.

Bias resistors 740a through 740k may also act as a leakage path when switch 700 is in the off state. Referring back to FIG. 4B, bias resistors 740a through 740k may form a third path that may be in parallel with the first path comprising the $C_{GS}$ and $C_{GD}$ capacitors as well as the second path comprising the $C_{DS}$ capacitor. Bias resistors 740a through 740k may have the same resistor value of $R_{BIAS1}$, which should be sufficiently large in order to reduce leakage in the off state. In an exemplary design, $R_{BIAS1}$ may be selected to be at least one order of magnitude larger than the $Z_{OFF}$ impedance shown in equation (1), or $R_{BIAS1} \geq 10 \cdot Z_{OFF}$. In another exemplary design, $R_{BIAS1}$ may be selected to be equal to or larger than the $Z_{OFF}$ impedance, or $R_{BIAS1} \geq Z_{OFF}$. $R_{BIAS1}$ may also be selected based on other criteria. In an exemplary design, $R_{BIAS1}$ may be greater than 10 KΩ. Other resistor values may also be selected for bias resistors 740.

A resistor may be added between the source and drain of a MOS transistor to improve linearity of the MOS transistor. In the exemplary design shown in FIG. 7, a bias resistor may be added between the source and drain of each MOS transistor having a non-zero $V_{SB}$ voltage in order to obtain matching bias conditions across all MOS transistors in a switch. The bias resistor would thus serve an additional function, which is to improve the reliability of the MOS transistor, when a bulk voltage is applied to the MOS transistor.

Figure 8:
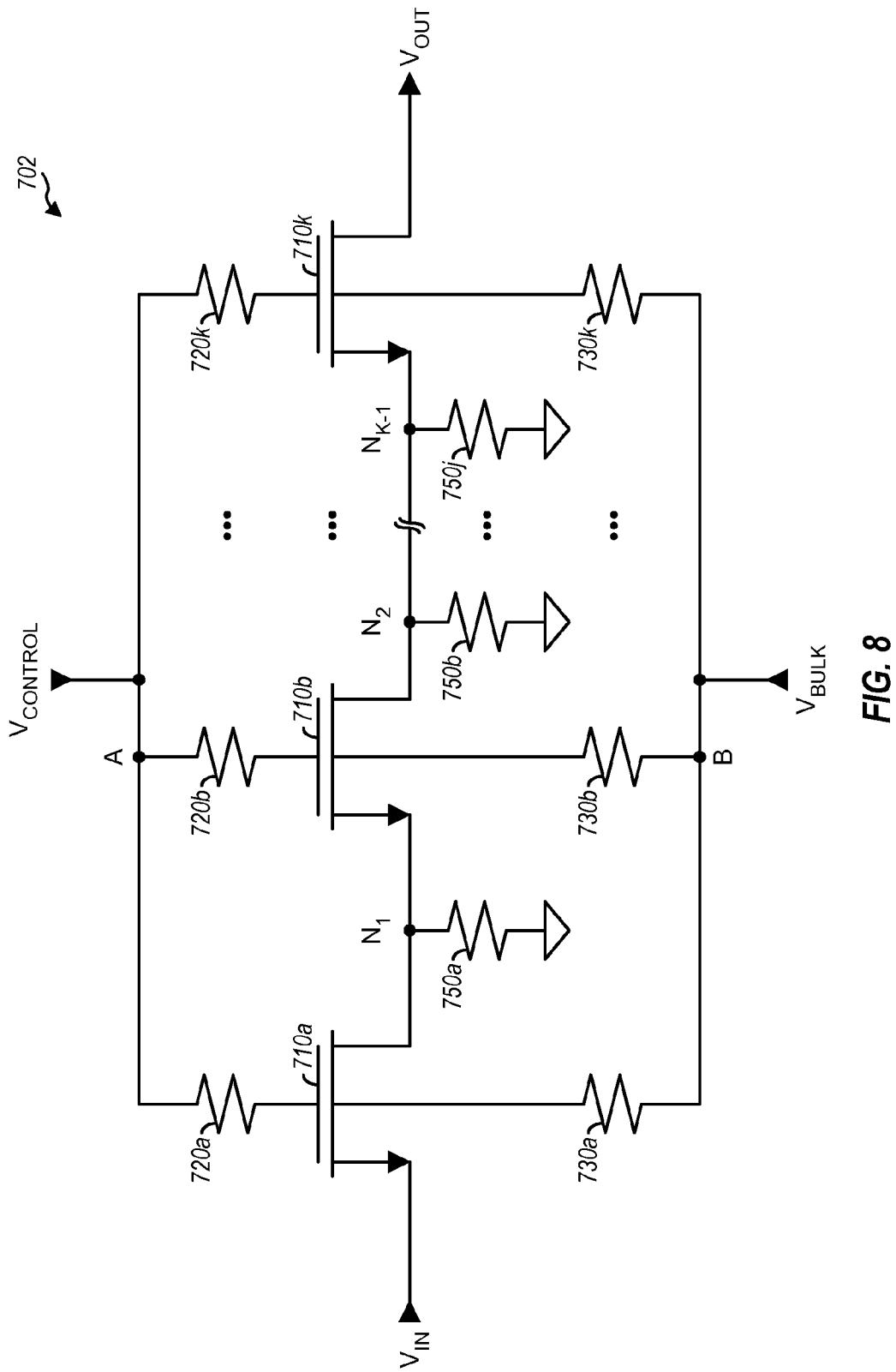

FIG. 8 shows a schematic diagram of an exemplary design of a switch 702 with connected bulk for improved switching performance and bias resistors for even voltage distribution to improve reliability in the off state. Switch 702 may also be used for any of the switches shown in FIG. 2. Switch 702 is implemented with K stacked NMOS transistors 710a through 710k, K source bias resistors 720a through 720k, and K bulk bias resistors 730a through 730k, which are coupled in similar manner as NMOS transistors 510a through 510k, resistors 520a through 520k, and resistors 530a through 530k in FIG. 3. Switch 702 further includes K−1 bias resistors 750a through 750j for the K−1 intermediate nodes $N_1$ through $N_{K-1}$, respectively, which are formed by the K stacked NMOS transistors 710a through 710k. Each bias resistor 750 has one end coupled to an associated intermediate node and the other end coupled to circuit ground (as shown in FIG. 8) or to the DC voltage of the $V_{IN}$ signal applied to switch 702.

Bias resistors 750a through 750j may maintain the intermediate nodes at approximately the same voltage (e.g., the source DC bias voltage) when switch 702 is in the off state. Each bias resistor 750 can provide a DC bias path to circuit ground, which may then maintain the voltage at the associated intermediate node at approximately 0V. This may then result in matching bias conditions for all K NMOS transistors 710a through 710k, which may then result in equal voltage splitting during the off state.

Bias resistors 750a through 750j may also act as a leakage path when switch 702 is in the on or off state. Bias resistors 750a through 750j may have the same resistor value of $R_{BIAS2}$, which should be sufficiently large in order to reduce insertion loss in the on state. In an exemplary design, $R_{BIAS2}$ may be greater than 10 KΩ. Other resistor values may also be selected for bias resistors 750.

Bias resistors 740 in FIG. 7 and bias resistors 750 in FIG. 8 may be implemented in various manners and with various IC process technologies. In an exemplary design, the bias resistors may be implemented with poly-silicon having higher resistivity. This may result in a smaller area for the bias resistors and may also reduce parasitic capacitance, both of which may be desirable. The bias resistors may also be implemented close to the NMOS transistors.

In an exemplary design, an apparatus may comprise a plurality of transistors and at least one resistor to implement a switch. The plurality of transistors (e.g., NMOS transistors 710 in FIGS. 7 and 8) may be coupled in a stack, may have a first voltage applied to a first transistor in the stack, and may have a second voltage applied to bulk nodes of the transistors. The second voltage may be lower than the first voltage. For example, the first voltage may be 0V, the second voltage may be a negative voltage, and each transistor in the stack may have a negative source-to-bulk voltage. The first voltage may be a DC component of an input RF signal applied to the switch. The transistors may comprise MOS transistors (e.g., NMOS transistors) or transistors of other types.

The at least one resistor may be coupled to at least one intermediate node in the stack in order to maintain matching bias conditions for the transistors when they are turned off. Each intermediate node may correspond to a connection between the source of one transistor and the drain of another transistor in the stack. In one exemplary design that is shown in FIG. 7, the at least one resistor (e.g., resistors 740) may comprise one resistor for each transistor in the stack, and each resistor may be coupled between the source and drain of an associated transistor. In another exemplary design that is shown in FIG. 8, each resistor (e.g., resistor 750) may be coupled between a respective intermediate node and the first voltage. For both exemplary designs, the at least one resistor may maintain the source of each transistor at the first voltage and/or maintain a zero drain-to-source voltage for each transistor in order to maintain matching bias conditions for the transistors when they are turned off. The at least one resistor may be implemented with poly-silicon or some other material having high resistivity in order to reduce area and parasitic capacitance. The at least one resistor may have a sufficiently large value, e.g., a value larger than the impedance of each transistor when it is turned off.

The apparatus may further comprise a plurality of bulk bias resistors (e.g., resistors 730 in FIGS. 7 and 8) for the plurality of transistors, one bulk bias resistor for each transistor. Each bulk bias resistor may be coupled between a bulk node of an associated transistor and the second voltage.

In another exemplary design, an integrated circuit may comprise a plurality of MOS transistors and at least one resistor to implement a switch. The plurality of MOS transistors may be coupled in a stack, may have a first voltage applied to a first MOS transistor in the stack, and may have a second voltage applied to bulk nodes of the plurality of MOS transistors. The second voltage may be lower than the first voltage. The at least one resistor may be coupled to at least one intermediate node in the stack in order to maintain matching bias conditions for the MOS transistors when they are turned off. In one exemplary design, the at least one resistor may comprise one resistor for each MOS transistor in the stack, with the resistor being coupled between the source and drain of the associated MOS transistor. In another exemplary design, each of the at least one resistor may be coupled between a respective intermediate node and the first voltage.

In yet another exemplary design, an apparatus (e.g., a wireless communication device) may comprise a module. The module may comprise multiple switches to implement multiple signal paths. The module may receive an RF signal and may route the RF signal via one of the multiple signal paths. Each switch may comprise a plurality of transistors coupled in a stack and at least one resistor. The plurality of transistors may have a first voltage applied to a first transistor in the stack and may have a second voltage applied to bulk nodes of the transistors. The second voltage may be lower than the first voltage. The at least one resistor may be coupled to at least one intermediate node in the stack (e.g., as shown in FIG. 7 or 8) in order to maintain matching bias conditions for the transistors when they are turned off. In an exemplary design, the module may be a switchplexer, e.g., switchplexer 260 in FIG. 2. In another exemplary design, the module may be a PA module that may further comprise at least one power amplifier to amplify the RF signal when enabled. The module may also be some other unit with multiple signal paths.

Figure 9:
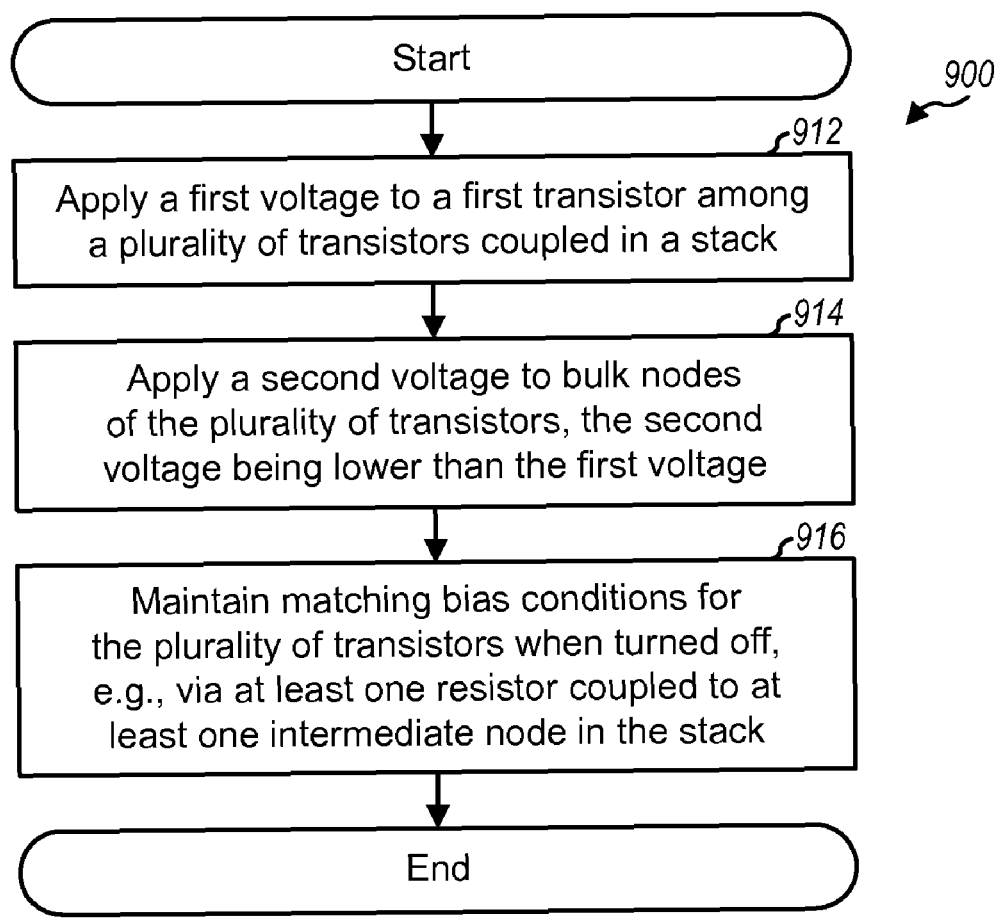
FIG. 9 shows a process for operating a switch.

FIG. 9 shows an exemplary design of a process 900 for operating a switch. A first voltage may be applied to a first transistor among a plurality of transistors coupled in a stack (block 912). A second voltage may be applied to bulk nodes of the plurality of transistors, with the second voltage being lower than the first voltage (block 914). Matching bias conditions may be maintained for the plurality of transistors when they are turned off, e.g., via at least one resistor coupled to at least one intermediate node in the stack (block 916). In an exemplary design of block 916, matching bias conditions may be maintained for the transistors with a resistor coupled between the source and drain of each transistor, which may maintain the source of each transistor at the first voltage. In another exemplary design of block 916, matching bias conditions may be maintained for the transistors with a resistor coupled between each intermediate node in the stack and the first voltage, which may maintain the source of each transistor at the first voltage.

The switches with connected bulk for improved switching performance and bias resistors for even voltage distribution, as described herein, may be implemented on an IC, an analog IC, an RFIC, a mixed-signal IC, an ASIC, a printed circuit board (PCB), an electronics device, etc. These switches may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc. The switches may also be implemented as SOI switches.

An apparatus implementing the switches described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a plurality of transistors coupled in a stack and having a first voltage applied to a source of a first transistor in the stack and further having a second voltage applied to bulk nodes of the plurality of transistors, the second voltage being lower than the first voltage; and
   at least one resistor coupled between at least one intermediate node in the stack and a ground voltage to maintain matching bias conditions for the plurality of transistors when turned off and sufficiently sized to reduce insertion loss for the plurality of transistors when turned on, each intermediate node corresponding to a connection between a source of one transistor and a drain of another transistor in the stack.

2. The apparatus of claim 1, further comprising:
   a plurality of bulk bias resistors for the plurality of transistors, one bulk bias resistor for each transistor, each bulk bias resistor is coupled between a bulk node of an associated transistor and the second voltage.

3. The apparatus of claim 1, the at least one resistor maintains the source of each of the plurality of transistors at the first voltage to maintain matching bias conditions for the plurality of transistors when turned off.

4. The apparatus of claim 1, the at least one resistor maintains zero drain-to-source voltage for each of the plurality of transistors to maintain matching bias conditions for the plurality of transistors when turned off.

5. The apparatus of claim 1, the first voltage is zero Volts, the second voltage is a negative voltage, and each of the plurality of transistors has a negative source-to-bulk voltage.

6. The apparatus of claim 1, the plurality of transistors form a switch receiving an input radio frequency (RF) signal, and the first voltage is determined by a direct current (DC) component of the input RF signal.

7. The apparatus of claim 1, the at least one resistor is implemented with poly-silicon.

8. The apparatus of claim 1, the at least one resistor has a value larger than an impedance of each transistor when turned off.

9. The apparatus of claim 1, the plurality of transistors comprises metal oxide semiconductor (MOS) transistors.

10. An integrated circuit comprising:
    a plurality of metal oxide semiconductor (MOS) transistors coupled in a stack and having a first voltage applied to a source of a first MOS transistor in the stack and further having a second voltage applied to bulk nodes of the plurality of MOS transistors, the second voltage being lower than the first voltage; and
    at least one resistor coupled between at least one intermediate node in the stack and a ground voltage to maintain matching bias conditions for the plurality of MOS transistors when turned off and sufficiently sized to reduce insertion loss for the plurality of transistors when turned on, each intermediate node corresponding to a connection between a source of one MOS transistor and a drain of another MOS transistor in the stack.

11. The integrated circuit of claim 10, further comprising:
    a plurality of bulk bias resistors for the plurality of MOS transistors, one bulk bias resistor for each MOS transistor, each bulk bias resistor is coupled between a bulk node of an associated MOS transistor and the second voltage.

12. An apparatus comprising:
a module comprising multiple switches to implement multiple signal paths, the module receiving a radio frequency (RF) signal and routing the RF signal via one of the multiple signal paths, each of the multiple switches comprising
  a plurality of transistors coupled in a stack and having a first voltage applied to a first transistor in the stack and further having a second voltage applied to bulk nodes of the plurality of transistors, the second voltage being lower than the first voltage, and
  at least one resistor coupled between at least one intermediate node in the stack and a ground voltage to maintain matching bias conditions for the plurality of transistors when turned off and sufficiently sized to reduce insertion loss for the plurality of transistors when turned on.

13. The apparatus of claim 12, the module is a switchplexer coupled to an antenna.

14. The apparatus of claim 12, the module is a power amplifier (PA) module further comprising at least one power amplifier for amplifying the RF signal.

15. A method comprising:
applying a first voltage to a source of a first transistor among a plurality of transistors coupled in a stack;
applying a second voltage to bulk nodes of the plurality of transistors, the second voltage being lower than the first voltage; and
maintaining matching bias conditions for the plurality of transistors when turned off in response to at least one resistor coupled between at least one intermediate node in the stack and a ground voltage and sufficiently sized to reduce insertion loss for the plurality of transistors when turned on.

16. An apparatus comprising:
means for applying a first voltage to a source of a first transistor among a plurality of transistors coupled in a stack;
means for applying a second voltage to bulk nodes of the plurality of transistors, the second voltage being lower than the first voltage; and
means for maintaining matching bias conditions for the plurality of transistors when turned off in response to at least one resistor coupled between at least one intermediate node in the stack and a ground voltage and sufficiently sized to reduce insertion loss for the plurality of transistors when turned on.

* * * * *